(12) United States Patent
Schlepple

(10) Patent No.: US 11,152,308 B2
(45) Date of Patent: Oct. 19, 2021

(54) INTERPOSER CIRCUIT

(71) Applicant: Finisar Corporation, Sunnyvale, CA (US)

(72) Inventor: Norbert Schlepple, San Jose, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 126 days.

(21) Appl. No.: 16/666,125

(22) Filed: Oct. 28, 2019

(65) Prior Publication Data

US 2020/0144190 A1    May 7, 2020

Related U.S. Application Data

(60) Provisional application No. 62/755,949, filed on Nov. 5, 2018.

(51) Int. Cl.
*H01L 23/538*    (2006.01)
*G02B 6/42*    (2006.01)
(Continued)

(52) U.S. Cl.
CPC .......... *H01L 23/5386* (2013.01); *G02B 6/428* (2013.01); *G02B 6/4257* (2013.01); *G02B 6/4279* (2013.01); *G02B 6/4281* (2013.01); *H01L 23/5387* (2013.01); *H01L 23/66* (2013.01); *H01L 24/13* (2013.01); *H01L 24/16* (2013.01); *H01L 25/18* (2013.01); *H04B 10/801* (2013.01); *H01L 2223/6605* (2013.01); *H01L 2223/6644* (2013.01); *H01L 2223/6694* (2013.01); *H01L 2224/13144* (2013.01); *H01L 2224/16225* (2013.01); *H01L 2924/1421* (2013.01); *H01L 2924/1426* (2013.01); *H04B 10/516* (2013.01); *H04B 10/66* (2013.01)

(58) Field of Classification Search
CPC . H01L 23/5386; H01L 23/5387; H01L 23/66; H01L 24/13; H01L 24/16; G02B 6/4257; G02B 6/4279; G02B 6/428; G02B 6/4281
See application file for complete search history.

(56) References Cited

U.S. PATENT DOCUMENTS 4,891,762 A    1/1990    Chotiros
4,967,260 A    10/1990    Butt
(Continued)

FOREIGN PATENT DOCUMENTS

EP    3220174 A1    9/2017
EP    3388876 A1    10/2018

OTHER PUBLICATIONS

International Search Report and Written Opinion dated Feb. 14, 2020, in related PCT Application No. PCT/US2019/059460 (14 pages).

(Continued)

*Primary Examiner* — Marc Anthony Armand
(74) *Attorney, Agent, or Firm* — Blank Rome LLP

(57) ABSTRACT

In an example, a communication module such as an optoelectronic communication module may include an integrated circuit (IC), an electrical interconnect, and an interposer circuit. The electrical interconnect may include a radio frequency (RF) interconnect or a direct current (DC) interconnect. The interposer circuit may be electrically coupled between the IC and the electrical interconnect.

20 Claims, 4 Drawing Sheets

(51) Int. Cl.
H01L 23/66 (2006.01)
H01L 23/00 (2006.01)
H01L 25/18 (2006.01)
H04B 10/80 (2013.01)
H04B 10/516 (2013.01)
H04B 10/66 (2013.01)

(56) References Cited

U.S. PATENT DOCUMENTS

| | | | |
|---|---|---|---|
| 5,199,165 | A | 4/1993 | Crawford et al. |
| 5,939,782 | A | 8/1999 | Malladi |
| 6,285,559 | B1 | 9/2001 | Fukiharu |
| 6,555,756 | B2 | 4/2003 | Nakamura et al. |
| 6,686,653 | B2 | 2/2004 | Jerominek et al. |
| 6,774,366 | B1 | 8/2004 | Friedman et al. |
| 6,879,488 | B2 | 4/2005 | Takeda et al. |
| 7,050,304 | B2 | 5/2006 | Hsu et al. |
| 7,139,448 | B2 | 11/2006 | Jain et al. |
| 7,889,956 | B2 | 2/2011 | Beausoleil et al. |
| 9,496,248 | B2 | 11/2016 | Lee et al. |
| 2006/0239612 | A1 | 10/2006 | De Dobbelaere et al. |
| 2009/0011547 | A1 | 1/2009 | Lu et al. |
| 2013/0242493 | A1* | 9/2013 | Shenoy ............... H01L 21/4853 361/679.21 |
| 2014/0015119 | A1 | 1/2014 | Bonkohara |
| 2016/0085038 | A1 | 3/2016 | Decker et al. |
| 2017/0092594 | A1* | 3/2017 | Song ................... H01L 21/4853 |
| 2018/0292607 | A1* | 10/2018 | Dong ................. G02B 6/12002 |
| 2020/0051899 | A1* | 2/2020 | Mallik ................... H01L 23/34 |

OTHER PUBLICATIONS

Zheng, et al. "Ultralow Power 80 Gb/s Arrayed CMOS Silicon Photonic Transceivers for WDM Optical Links" Journal of Lightwave Technology, vol. 30, No. 4, Feb. 15, 2012 p. 641-650 (10 pgs).

* cited by examiner

INTERPOSER CIRCUIT

CROSS-REFERENCE TO RELATED APPLICATION

This application claims the benefit of and priority to U.S. Provisional App. No. 62/755,949 filed Nov. 5, 2018 which is incorporated herein by reference.

FIELD

The embodiments discussed herein are related to an interposer circuit.

BACKGROUND

Unless otherwise indicated herein, the materials described herein are not prior art to the claims in the present application and are not admitted to be prior art by inclusion in this section.

Optoelectronic modules, such as optoelectronic transceiver or transponder modules, are increasingly used in electronic and optoelectronic communication. Optoelectronic modules generally include one or more transmitters and/or receivers, as well as one or more printed circuit boards ("PCBs") with circuitry related to the transmitters/receivers, such as driving and amplifying circuitry. Electrical data signals generally pass through this circuitry as they pass between the transmitters/receivers and a host device in which the optoelectronic module is positioned.

The subject matter claimed herein is not limited to implementations that solve any disadvantages or that operate only in environments such as those described above. Rather, this background is only provided to illustrate one example technology area where some implementations described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described herein generally relate to an interposer circuit, e.g., to electrically couple radio frequency (RF) and/or direct current (DC) interconnects to integrated circuits (ICs).

In an example embodiment, a communication module includes an IC, an electrical interconnect, and an interposer circuit. The electrical interconnect may include a RF interconnect or a DC interconnect. The interposer circuit may be electrically coupled between the IC and the electrical interconnect.

In another example embodiment, a communication module includes one or more ICs, multiple electrical interconnects, and an interposer circuit. The one or more ICs include at least one of: an electrical IC comprising at least one of a driver or a transimpedance amplifier; and an optical integrated circuit (OIC) comprising at least one of an optical source, an optical modulator, or an optical receiver. The electrical interconnects include radio frequency (RF) interconnects. The interposer circuit is electrically coupled between a first IC of the one or more ICs and the RF interconnects. The communication module is devoid of wire bonds between the first IC and all RF interconnects that are electrically coupled to the first IC.

In another example embodiment, a communication module includes an OIC, an electrical interconnect, an interposer circuit, and an optical coupling element. The OIC includes an optical modulator. The electrical interconnect includes a RF interconnect or a direct current (DC) interconnect. The interposer circuit is electrically coupled between the optical modulator and the electrical interconnect. The optical coupling element is positioned between a source of continuous wave (CW) input light and an input of the optical modulator. The input of the optical modulator is located at a same side of the optical modulator to which the interposer circuit is coupled to input an RF modulation signal to the optical modulator. The interposer circuit extends out of plane over the optical coupling element from the electrical interconnect to the optical modulator.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Figure 1:
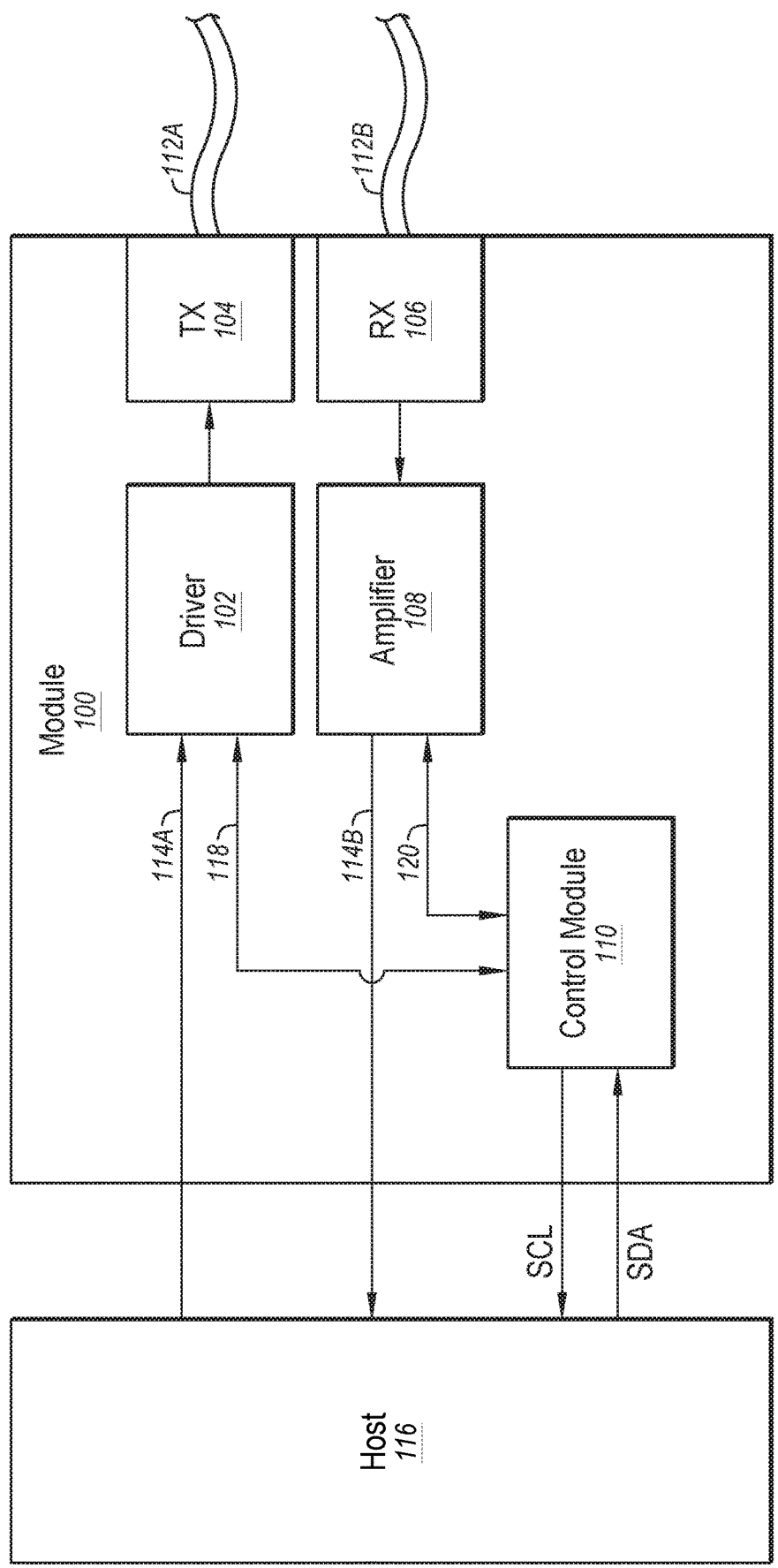
FIG. 1 illustrates a simplified block diagram of an example communication module.

In some communication modules, active RF components—such as modulators, drivers, receivers, and amplifiers—are electrically coupled to electrical interconnects, e.g., of a surrounding package or box, of a PCB in the module, and/or of other ICs, using shims (e.g., shims made of ceramic circuits) and wire bonds. For example, a communication module may include a driver and an optical modulator (each is an example of an active RF component) enclosed in a hermetically sealed box, where the box includes on an interior thereof various RF interconnects (which in turn are electrically coupled through the box to, e.g., a PCB external to the box), a first ceramic shim is positioned between the RF interconnects of the box and the driver, a second ceramic shim is positioned between the driver and the optical modulator, a first set of wire bonds electrically couple the RF interconnects of the box to the first ceramic shim, a second set of wire bonds electrically couple the first ceramic shim to the driver, a third set of wire bonds electrically couple the driver to the second ceramic shim, and a fourth set of wire bonds electrically couple the second ceramic shim to the optical modulator.

Wire bonds and ceramic circuits may be problematic at high data rates (e.g., 28 gigabits per second (G) or higher) and/or in other circumstances. For example, ceramic requires rigid planar alignment (e.g., between the ceramic shim, the IC, and the RF interconnects) and has relatively tight tolerances that can be difficult to meet. Ceramic circuits are generally unable to achieve impedance less than about 100 ohms differential (e.g., due to minimum ceramic thickness), eliminating ceramic as a candidate for lower impedance applications (e.g., less than 100 ohms differential). Wire bond length and/or shape may be a significant contributor of loss and/or resonance, particularly at high data rates. The relatively short length of wire bonds at high data rates (e.g., to reduce loss and/or resonance as much as possible) reduces thermal isolation of ICs (compared to longer wire bonds), causing significant passive thermal loads on temperature-controlled ICs such as optical modulators and leading to excess power consumption. In addition, when designing new devices or systems, ceramic has a relatively high non-refundable expense (e.g., $5,000) and long lead time (e.g., 10-20 weeks) compared to some other technologies.

In comparison, example embodiments relate to an interposer circuit, such as a flex circuit or a rigid circuit, that may be used in place of wire bonds and ceramic to electrically couple ICs to electrical interconnects, e.g., of a surrounding package or box, of a PCB in the module, and/or of other ICs. Interposer circuits may have a number of advantages over wire bonds and ceramic. For example, interposer circuits may reduce part count. Specifically in the previous example of a driver and optical modulator, a single flex circuit may be used to electrically couple the RF interconnects of the box to the driver and to electrically couple the driver to the optical modulator, rather than using two ceramic shims and four sets of wire bonds. In addition, flex circuits are flexible, reducing or eliminating the need for rigid planar alignment, loosening tolerances, and/or permitting out-of-plane routing of the flex circuit over, under, and/or around obstacles. Flex circuits may be electrically coupled anywhere on an IC, as opposed to being limited to coupling along the edge or perimeter of the IC. Flex circuits additionally have greater impedance flexibility than ceramic, being suitable for impedances above and below 100 ohms differential, such as 50 ohms differential. Flex circuits may be electrically coupled to electrical interconnects (e.g., of a box or an IC) using gold bumps or other suitable bumps to reduce or eliminate the impedance mismatch of wire bonds. The use of flex circuits permits greater physical separation between the IC and its environment than wire bonds (which must be short at high data rates to reduce losses), leading to improved thermal isolation and lower power consumption in temperature-controlled applications compared to wire bond and ceramic. Flex circuits permit the coupling of surface mount devices (SMDs), such as capacitors, on the flex interposer and therefore close to contacts, and permit subassemblies to be formed and tested prior to assembling the entire package/box and/or communication module. Thus, defective subassemblies may be tested and discarded prior to assembly of the complete package/box and/or communication module, potentially improving reliability of the packages/boxes and/or communication modules. In addition, when designing new devices or systems, flex circuits have a relatively low non-refundable expense (e.g., a couple thousand dollars) and short lead time (e.g., a few weeks)

The embodiments described herein can be implemented in various operating environments, including, for example, in optoelectronic modules or other communication modules. As used herein, the term "optoelectronic module" includes modules having both optical and electrical components. Examples of optoelectronic modules include transponders, transceivers, transmitters, and/or receivers. Optoelectronic modules can be used, for instance, in telecommunications networks, local area networks, metro area networks, storage area networks, wide area networks, and the like and can be configured to conform with one or more standardized form factors or multi-source agreements ("MSAs"), such as the XENPAK, XPAK, SFF, SFP, SFP+, XFP, QSFP and CFP form factors, without restriction. It will be appreciated, however, that the electronic and optoelectronic modules need not comply with standardized form factor requirements and may have any size or configuration necessary according to a particular design. Alternately or additionally, the optoelectronic modules can be suitable for optical signal transmission and reception at a variety of per-second data rates. Furthermore, optoelectronic modules of other types and configurations, or having components that differ in some respects from those illustrated and described herein, can also benefit from the principles disclosed herein.

Reference will now be made to the drawings wherein like structures will be provided with like reference designations. It should be understood that the drawings are diagrammatic and schematic representations of exemplary embodiments and, accordingly, are not limiting of the scope of the present invention, nor are the drawings necessarily drawn to scale.

FIG. 1 illustrates a simplified block diagram of an example communication module 100 (hereinafter "module 100"), arranged in accordance with at least one embodiment described herein. The module 100 is an optoelectronic transceiver module in this example. As illustrated in FIG. 1, the module 100 includes a driver 102, a transmitter 104 ("TX 104" in FIG. 1), a receiver 106 ("RX 106 in FIG. 1), an amplifier 108 and a control module 110.

In some embodiments, the transmitter 104 may be included in a package or box, such as within a transmitter optical subassembly (TOSA) box or within a bidirectional optical subassembly (BOSA) box or within a TX/RX optical engine box, either of which may include a fiber receptacle to receive an end of an optical fiber 112A. The transmitter 104 may include an optical source such as a modulated or continuous wave (CW) laser diode or LED and optionally an optical modulator. The optical modulator, if included, may include a silicon (Si) photonic integrated circuit (PIC) with one or more waveguides through which CW light may transmitted and modulated to generate a modulated optical data signal that may be output from the transmitter 104 into the optical fiber 112A. The one or more waveguides of the PIC may be configured as, e.g., a Mach-Zehnder modulator (MZM).

The receiver 106 may be included in a package or box, such as within a receiver optical subassembly (ROSA) box or within a BOSA box or within a TX/RX optical engine box. The ROSA box, the BOSA box, or the TX/RX optical engine box may include a fiber receptacle to receive an end of an optical fiber 112B. The receiver 106 may include an optical receiver such as a photodiode.

During operation, the module 100 is configured to receive one or more data-carrying electrical signals 114A from a host 116, which can be any computing system capable of communicating with the module 100, for transmission as one or more outbound optical data signals on the optical fiber 112A (or multiple optical fibers). More particularly, the driver 102 receives the data-carrying electrical signal 114A and applies a corresponding modulation signal to the optical source within the transmitter 104 (e.g., if the optical source is implemented as a directly modulated laser (DML)) or to the optical modulator within the transmitter 104 (e.g., if the optical source is implemented as a CW source) to emit one or more corresponding outbound optical data signals onto the optical fiber 112A (or multiple optical fibers).

The module 100 is also configured to receive and convert an inbound optical data signal into a data carrying electrical signal 114B provided to the host 116. In more detail, the inbound optical data signal is received from the optical fiber 112B (or from multiple optical fibers) by the optical receiver (or multiple optical receivers) within the receiver 106. Each optical receiver within the receiver 106 converts the corresponding inbound optical data signal to a data-carrying electrical signal which is provided to the amplifier 108. Each data-carrying electrical signal is amplified by the amplifier 108 (which may include a pre-amplifier and/or a post-amplifier) and provided to the host 116 as the corresponding data carrying electrical signal 114B.

The control module 110 receives information from the driver 102 and/or the amplifier 108 and/or adjusts settings on the driver 102 and/or the amplifier 108 to optimize dynamically varying performance of the module 100. Alternatively or additionally, a host communication interface such as an I2C interface with serial data ("SDA") and serial clock ("SCL") lines, or other suitable communication interface, may be implemented to communicate with the host 116.

One or more of the optical source, the optical modulator, the optical receiver, the driver 102, and/or the amplifier 108 of FIG. 1 may be electrically coupled to electrical interconnects of a corresponding box or other IC using an interposer circuit such as a flex circuit, as opposed to using ceramic shims and wire bonds, as described in more detail with respect to other figures herein.

Figure 2A:
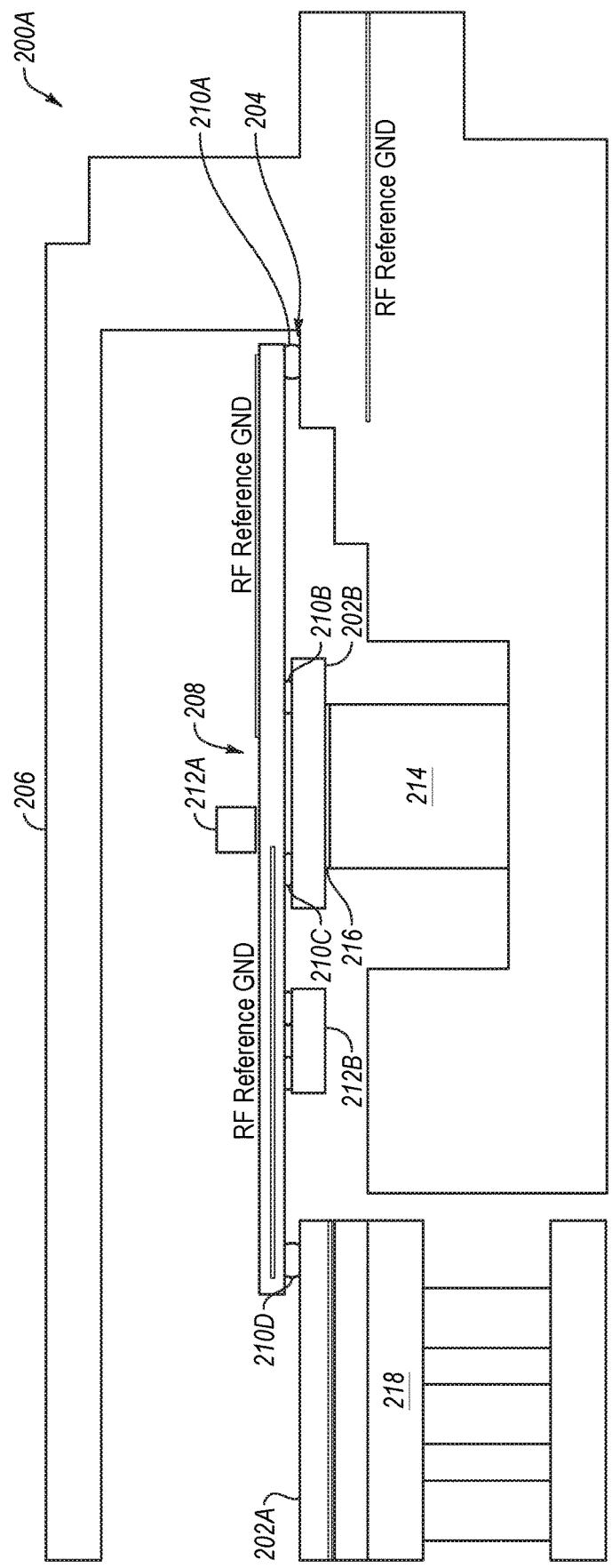
FIGS. 2A and 2B illustrate other example communication modules.
Figure 2B:
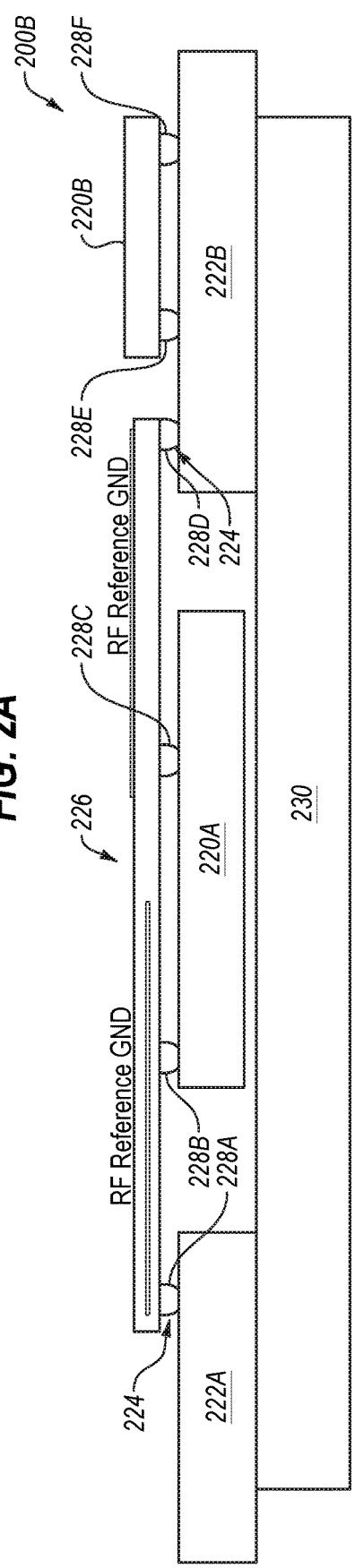

FIGS. 2A and 2B illustrate example communication modules 200A, 200B (hereinafter "module 200A" or "module 200B", collectively "modules 200"), arranged in accordance with at least one embodiment described herein. Each of the modules 200 may include, may be included in, and/or may correspond to the module 100 of FIG. 1 or a portion thereof. FIG. 2A illustrates an example hermetically-sealed implementation, while FIG. 2B illustrates an example non-hermetic implementation.

As illustrated in FIG. 2A, the module 200A includes two ICs 202, including an optical IC (hereinafter "OIC") 202A implemented as an optical modulator and an IC 202B implemented as a driver. More generally, embodiments described herein may include one or more ICs, each IC including an electrical IC (such as a driver or transimpedance amplifier (TIA)) or an optical IC (such as an optical modulator or an optical receiver). Each of the IC 202B and the OIC 202A of FIG. 2A may include, may be included in, and/or may correspond to one or more of the driver 102, the transmitter 104, the receiver 106, and/or the amplifier 108 of FIG. 1.

The module 200A additionally includes an electrical interconnect 204, e.g., located on an interior of a box or housing 206 of the module 200A. The box 206 of the module 200A may include and/or correspond to the TOSA box, the ROSA box, the BOSA box, and/or the TX/RX optical engine box discussed with respect to FIG. 1. In this example, a single electrical interconnect 204 implemented as a RF interconnect is illustrated in FIG. 2A. More generally, the module 200A may include one or more electrical interconnects, each of which may include a RF interconnect or a DC interconnect.

The module 200A additionally includes an interposer circuit 208 electrically coupled between the IC 202B and the electrical interconnect 204 and between the IC 202B and the OIC 202A. In particular, a first portion of the interposer circuit 208 is electrically coupled between the IC 202B and the electrical interconnect 204 and a second portion of the interposer circuit 208 is electrically coupled between the OIC 202A and the IC 202B. The IC 202B and the OIC 202A may each include one or more electrical interconnects, e.g., contact pads, at which the interposer circuit 208 may electrically couple to the IC 202B or the OIC 202A. A length of the first portion of the interposer circuit 208 and a distance between the IC 202B and the electrical interconnect 204 may be at least 1 millimeter, such as between about 5-10 millimeters, in some embodiments. Similarly, a length of the second portion of the interposer circuit 208 and a distance between the IC 202B and the OIC 202A may be at least 1 millimeter, such as between about 5-10 millimeters.

In some embodiments, the electrical interconnect 204 is one of multiple RF interconnects of the module 200A. In this and other embodiments, all of the RF interconnects of the module 200A that are electrically coupled to the IC 202B may be electrically coupled to the IC 202B through the interposer circuit 208 without any wire bonds or ceramic circuits between the IC 202B and the RF interconnects. In some embodiments, the IC 202B may nevertheless have one or more wire bonds that electrically couple the IC 202B to one or more DC interconnects of the module 200A. Alternatively, the module 200A may be completely devoid of wire bonds between the IC 202B and all electrical interconnects (both RF and DC) of the module 200A to which the IC 202B is electrically coupled.

As illustrated in FIG. 2A, the module 200A further includes multiple bump connectors 210A-210D (collectively "bump connectors 210"). Each of the bump connectors 210 may be referred to as a RF bump if included in a RF signal path or as a DC bump if included in a DC signal path. In the illustrated embodiment, each of the bump connectors 210 is a RF bump. Alternatively or additionally, each of the bump connectors 210 may include a gold bump, a solder bump, or a bump of other suitable material.

The bump connector 210A may electrically couple the electrical interconnect 204 to the interposer circuit 208 (e.g., to a RF interconnect of the interposer circuit 208). The bump connector 210B may electrically couple the interposer circuit 208 (e.g., a RF interconnect of the interposer circuit 208) to the IC 202B, e.g., to a RF interconnect such as a RF input of the IC 202B. The bump connector 210C may electrically couple the IC 202B, e.g., a RF interconnect such as a RF output of the IC 202B, to the interposer circuit 208 (e.g., to a RF interconnect of the interposer circuit 208). The bump connector 210D may electrically couple the interposer circuit 208 (e.g., a RF interconnect of the interposer circuit 208) to the OIC 202A, e.g., to a RF interconnect such as a RF input of the OIC 202A.

In some embodiments, the interposer circuit 208 may enable one or more surface mount devices (SMDs) 212A, 212B (collectively hereafter "SMDs 212"), to be coupled (mechanically and electrically) to the interposer circuit 208 close to electrical contacts. FIG. 2A illustrates two SMDs 212 coupled to the interposer circuit 208, including a capacitor 212A and a DC block 212B. The capacitor 212A may include a one microfarad capacitor or other suitable capacitor. More generally, the interposer circuit 208 may include one or more SMDs, or in some cases no SMDs, coupled to the interposer circuit 208, where each SMD may include a capacitor, a resistor, an inductor, a DC block, or other suitable SMD.

As illustrated in FIG. 2A, the IC 202B is mounted on and thermally coupled to a socket or heat sink 214, optionally with a thermal cushion 216 positioned between the IC 202B and the socket or heat sink 214. The thermal cushion 216 may include thermal paste or other thermally conductive material to improve a thermal connection between the IC 202B and the socket or heat sink 214.

The OIC 202A is mounted on and thermally coupled to a thermoelectric cooler (TEC) 218 to provide temperature control of the OIC 202A. The OIC 202A may be configured to operate at a target temperature and the TEC 218 may be configured to heat or cool the OIC 202A to operate at the target temperature. For example, if an operating environment of the module 200A is above the target temperature, the TEC 218 may cool the OIC 202A to the target temperature, whereas if the operating environment is below the target temperature, the TEC 218 may heat the OIC 202A to the target temperature. The use of the interposer circuit 208 to electrically couple the IC 202B to the OIC 202A may significantly reduce the passive thermal load on the TEC 218, thereby reducing the power consumption of the TEC 218, by providing better thermal isolation of the OIC 202A compared to using a ceramic shim and wire bonds, for example.

The interposer circuit 208 may be coupled to the OIC 202A or the IC 202B at virtually any location on a top surface of the OIC 202A or the IC 202B, assuming the interposer circuit 208 at least partially passes over the top surface of the OIC 202A or the IC 202B. In other embodiments, the interposer circuit 208 may at least partially pass under or to the side of the OIC 202A or the IC 202B, in which case the interposer circuit 208 may be coupled to the OIC 202A or the IC 202B at virtually any location on a bottom surface or side of the OIC 202A or the IC 202B. In some embodiments, the OIC 202A or the IC 202B may be flip-chip bonded to the TEC 218 or the socket or heat sink 214, in which case the "top surface" of the OIC 202A or the IC 202B may refer to a surface of the OIC 202A or the IC 202B that is closest to a top wall of the module 200A.

When wire bonds are implemented, they are typically coupled to the IC or the OIC along or proximate to a perimeter of the top surface of the IC or the OIC. In comparison, the interposer circuit 208 may be coupled to the OIC 202A or the IC 202B at virtually any location on the top surface of the OIC 202A or the IC 202B. In these and other embodiments, the top surface of the OIC 202A or the IC 202B may have a perimeter and an interior bounded by the perimeter and the interposer circuit 208 may be electrically coupled to the OIC 202A or the IC 202B within the interior of the top surface. For example, the interposer circuit 208 may be electrically coupled to the OIC 202A or the IC 202B at least 0.5 millimeters inward from the perimeter of the top surface.

Referring to FIG. 2B, the module 200B includes two ICs 220, including an OIC 220A implemented as an optical modulator and an IC 220B implemented as a driver. More generally, embodiments described herein may include one or more ICs, each IC including an electrical IC (such as a driver or transimpedance amplifier (TIA)) or an optical IC (such as an optical modulator or an optical receiver). Each of the OIC 220A and the IC 220B of FIG. 2B may include, may be included in, and/or may correspond to one or more of the driver 102, the transmitter 104, the receiver 106, and/or the amplifier 108 of FIG. 1.

The module 200B additionally includes two PCBs 222A, 222B (collectively hereafter "PCBS 222"), each including an electrical interconnect 224. In this example, a single electrical interconnect 224 implemented as a RF interconnect for each of the PCBs 222A, 222B of the module 200B is illustrated in FIG. 2B. More generally, the module 200B and/or its various components may include one or more electrical interconnects, each of which may include a RF interconnect or a DC interconnect.

The module 200B additionally includes an interposer circuit 226 electrically coupled between the PCB 222A (e.g., the electrical interconnect 224) and the OIC 220A and between the OIC 220A and the PCB 222B (e.g., the electrical interconnect 224). In particular, a first portion of the interposer circuit 226 is electrically coupled between the PCB 222A and the OIC 220A and a second portion of the interposer circuit 226 is electrically coupled between the OIC 220A and the PCB 222B. The OIC 220A may include one or more electrical interconnects, e.g., contact pads, at which the interposer circuit 226 may electrically couple to the OIC 220A.

In some embodiments, each of the electrical interconnects 224 is one of multiple RF interconnects of the module 200B. In this and other embodiments, all of the RF interconnects of the module 200B that are electrically coupled to the OIC 220A may be electrically coupled to the OIC 220A through the interposer circuit 226 without any wire bonds or ceramic circuits between the OIC 220A and the RF interconnects. In some embodiments, the OIC 220A may nevertheless have one or more wire bonds that electrically couple the OIC 220A to one or more DC interconnects of the module 200B. Alternatively, the module 200B may be completely devoid of wire bonds between the OIC 220A and all electrical interconnects (both RF and DC) of the module 200B to which the OIC 220A is electrically coupled.

As illustrated in FIG. 2B, the module 200B further includes multiple bump connectors 228A-228F (collectively "bump connectors 228"). Each of the bump connectors 228 may be referred to as a RF bump if included in a RF signal path or as a DC bump if included in a DC signal path. In the illustrated embodiment, each of the bump connectors 228 is a RF bump. Alternatively or additionally, each of the bump connectors 228 may include a gold bump, a solder bump, or a bump of other suitable material.

The bump connector 228A may electrically couple the electrical interconnect 224 of the PCB 222A to the interposer circuit 226, e.g., to a RF interconnect of the interposer circuit 226. The bump connector 228B may electrically couple the interposer circuit 226, e.g., a RF interconnect of the interposer circuit 226, to the OIC 220A, e.g., to a RF interconnect of the OIC 220A. The bump connector 228C may electrically couple the OIC 220A, e.g., a RF interconnect of the OIC 220A, to the interposer circuit 226, e.g., to a RF interconnect of the interposer circuit 226. The bump connector 228D may electrically couple the interposer circuit 226, e.g., a RF interconnect of the interposer circuit 226, to the electrical interconnect 224 of the PCB 222B. The bump connectors 228E and 228F may electrically couple corresponding electrical interconnects of the PCB 222B to the IC 220B, e.g., to corresponding electrical interconnects of the IC 220B.

Although not illustrated in FIG. 2B, the interposer circuit 226 may optionally include one or more SMDs coupled thereto.

As illustrated in FIG. 2B, the OIC 220A and the PCBs 222 are mounted on and thermally coupled to a socket or heat sink 230, optionally with a thermal cushion 232 positioned between the OIC 220A and the socket or heat sink 230. The thermal cushion 232 may include thermal paste or other thermally conductive material to improve a thermal connection between the socket or heat sink 230 and the components mounted thereto.

As in FIG. 2A, in FIG. 2B, the interposer circuit 226 may be coupled to the OIC 220A at virtually any location on a top surface (or other surface) of the OIC 220A. For example, the bump connector 228C electrically couples the interposer circuit 226 to a location well within an interior of a top surface of the OIC 220A.

Figure 3A:
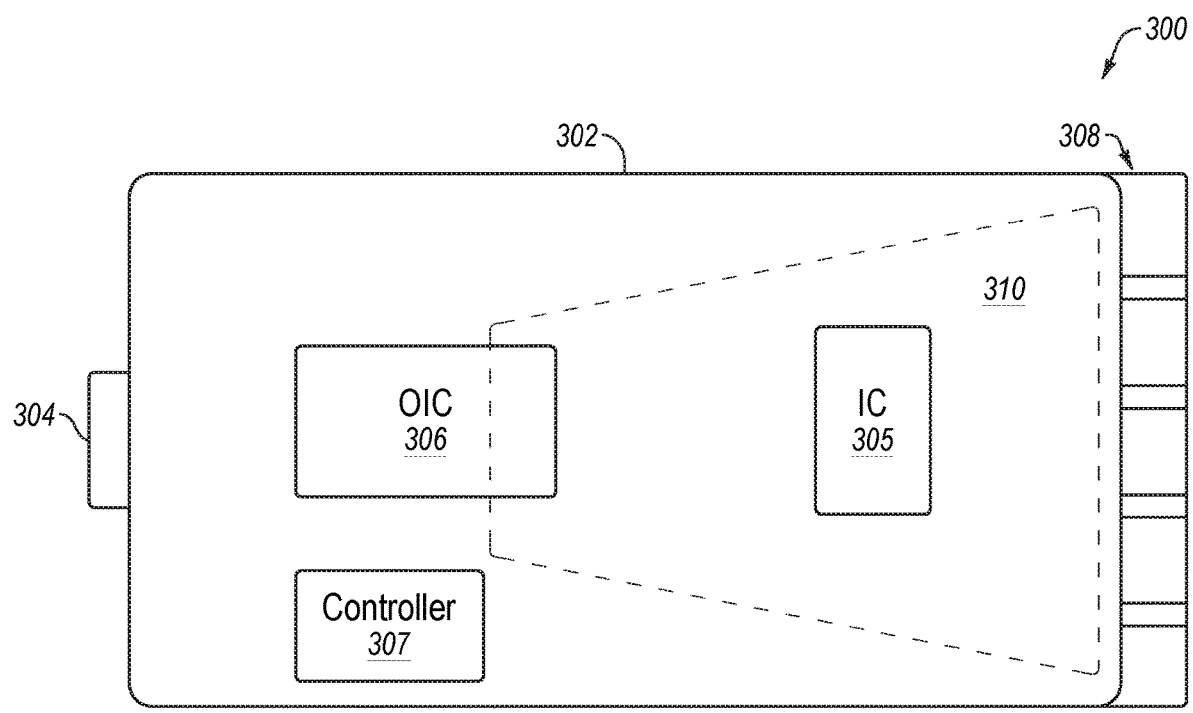
FIG. 3A is a top view of an example TX/RX optical engine.

FIG. 3A is a top view of an example TX/RX optical engine 300 (hereinafter "engine 300"), arranged in accordance with at least one embodiment described herein. The engine 300 may include a box or housing 302, an optical feedthrough 304, an RF IC 305, an OIC 306, a controller 307, one or more RF feedthroughs, one or more interposer circuits 310 (depicted as being transparent in FIG. 3A to make covered parts of the RF IC 305 and the OIC 306 visible in FIG. 3A), and/or other systems and devices. The RF IC 305 may include, may be included in, and/or may correspond to any of the RF ICs discussed herein, such as the driver 102 or the amplifier 108 of FIG. 1, or other drivers or amplifiers (e.g., TIAs) or RF ICs discussed herein. The OIC 306 may include, may be included in, and/or may correspond to any of the OICs discussed herein, such as any of the optical sources, optical modulators, optical receivers, or other OICs discussed herein. The interposer circuit 310 of FIG. 3A may include, may be included in, and/or more correspond to any of the interposer circuits discussed herein.

The box 302 may house the various components of the engine 300 and may include or correspond to the TX/RX optical engine box discussed with respect to FIG. 1. The RF feedthroughs 308 may electrically couple the engine 300 to a PCB of a communication module in which the engine 300 is included and/or to electrically couple the engine 300 to a host device to enable communication of RF signals between the engine 300 and the communication module PCB or the host device. The RF feedthroughs 308 may each terminate on an interior of the box 302 at a corresponding RF interconnect. Some or all of the RF interconnects on the interior of the box 302 may be electrically coupled through the interposer circuit 310 to the RF IC 305 and/or the OIC 306.

Figure 3B:
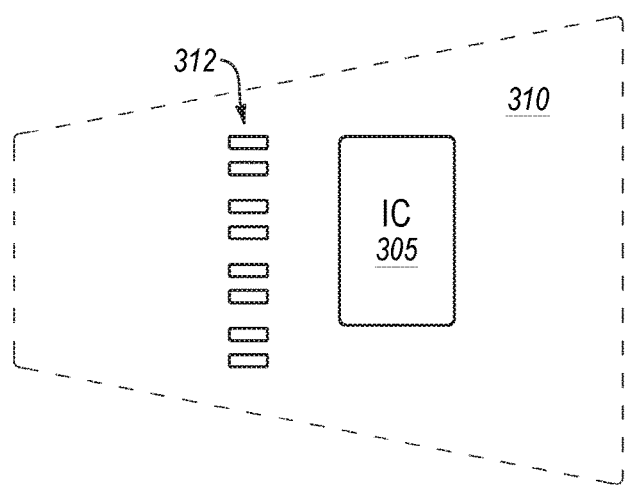
FIG. 3B is a bottom view of interposer circuits, a driver, and a TIA of FIG. 3A.

FIG. 3B is a bottom view of the interposer circuit 310 (depicted as being transparent in FIG. 3B) and the RF IC 305 of FIG. 3A, arranged in accordance with at least one embodiment described herein. The interposer circuit 310 and the RF IC 305 are shown electrically coupled together in an example subassembly including one interposer circuit and one IC. In other embodiments, a subassembly may more generally include one or more interposer circuits and one or more ICs (e.g., electrical IC and/or optical IC). According to embodiments described herein, each subassembly may be tested as a subassembly before being assembled into the engine 300. By testing each subassembly prior to assembly into the engine 300, faulty subassemblies may be screened and eliminated from the assembly line in advance.

As illustrated in FIG. 3B, the interposer circuit 310 may further include one or more SMDs 312 to be coupled (mechanically and electrically) to the interposer circuit 310 close to electrical contacts, e.g., close to electrical contacts of the interposer circuit 310 that may be electrically coupled to electrical contacts of the RF IC 305.

Figure 4A:
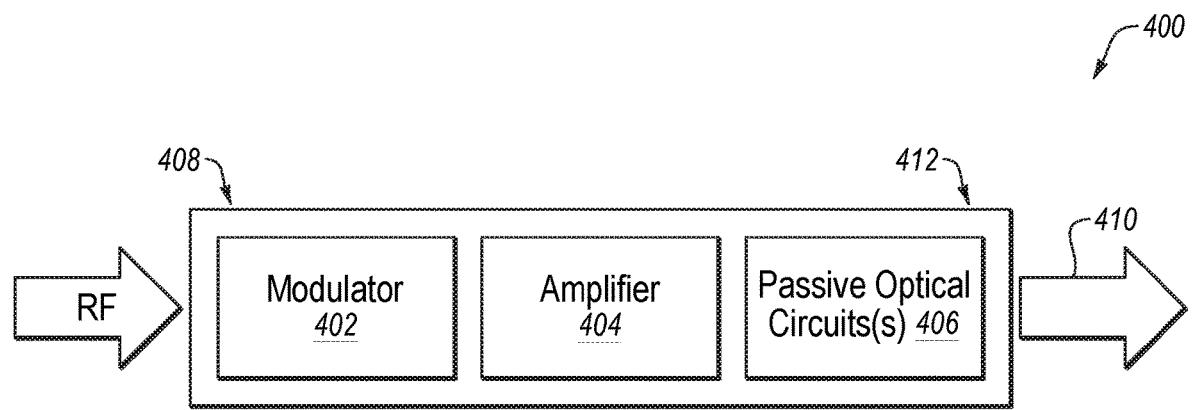
FIG. 4A is a top view of an example optical modulator that may be included in the communication modules of FIGS. 1-2B.

FIG. 4A is a top view of an example optical modulator 400, arranged in accordance with at least one embodiment described herein. The optical modulator 400 may include, may be included in, and/or may correspond to other optical modulators or OICs discussed herein. The optical modulator 400 may include a PIC-based optical modulator including, e.g., one or more of UH a modulation element 402 (hereinafter "modulator 402"), an amplifier 404, and one or more passive optical circuits 406. The modulator 402 may include, e.g., one or more MZMs or other modulation elements.

In operation, a CW signal (e.g., received from an optical source) or at least a portion thereof is routed into the modulator 402 at, near, or from a first end 408 of the optical modulator 400. As the CW signal travels through the modulator 402, the modulator 402 is modulated with an RF modulation signal ("RF" in FIG. 4A), typically received at the first end 408 of the optical modulator 400, to output a modulated optical data signal 410 from a second end 412 of the optical modulator 400 that is opposite the first end 408.

In communication modules that use ceramic and wire bonds, the CW signal is typically input from an opposite end of the optical modulator 400 than the RF signal. For example, the CW signal may be input at the second end 412 rather than the first end 408, since the planar alignment required between the ceramic shim(s) and the optical modulator 400 may not accommodate coupling optics (e.g., a collimating and/or focusing lens) to couple the CW signal into the optical modulator 400 at the first end 408. Thus, the CW signal is typically input from the second end 412 and it travels the length of the optical modulator 400 from the second end 412 to the first end 408 before being routed into the modulator 402. The CW signal experiences optical loss as it travels from the second end 412 to the first end 408.

According to embodiments described herein, however, an interposer circuit such as a flex circuit may couple the RF signal into the optical modulator 400 at the first end 408 or any other location of the optical modulator 400. When the interposer circuit is implemented as a flex circuit, it may be routed out of plane, over, under, or otherwise around the coupling optics to accommodate the coupling optics for the CW signal, such that the CW signal may be input into the optical modulator 400 at the first end 408. By inputting the CW signal at the first end 408 rather than the second end 412, the optical losses experienced by the CW signal as it travels from the second end 412 to the first end 408 may be avoided since the CW signal no longer travels from the second end 412 to the first end 408.

Figure 4B:
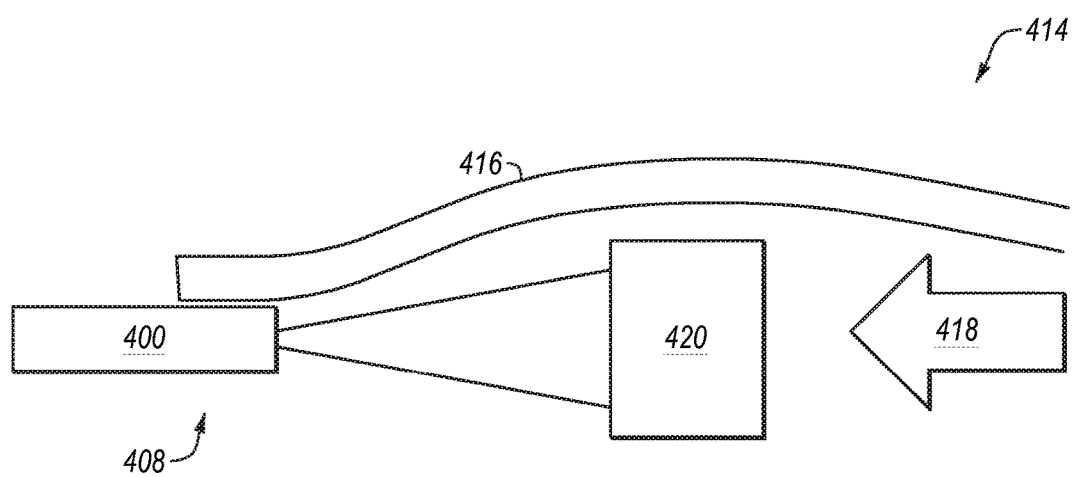
FIG. 4B is a perspective side view of a portion of a communication module that includes the optical modulator of FIG. 4A, all arranged in accordance with at least one embodiment described herein.

FIG. 4B is a side view of a portion of a communication module 414 (hereinafter "module 414") that includes the optical modulator 400 of FIG. 4A, arranged in accordance with at least one embodiment described herein. As illustrated, an interposer circuit 416 implemented as a flex circuit electrically couples the first end 408 of the optical modulator 400 to one or more RF interconnects of the module 414 (e.g., one or more RF interconnects of a driver of the module 414).

The module 414 also includes coupling optics, such as a lens 412 and/or other optical coupling element(s), that optically couples a CW signal 418 into the optical modulator 400 at the same first end 408 as the RF signal via the interposer circuit 416. In FIG. 4B, the interposer circuit 416 is routed up and over, e.g., out of plane, over the lens 412 to accommodate the lens 412.

The module 414, the interposer circuit 416, and the coupling optics of FIG. 4B may include, may be included in, and/or may correspond to other communication modules, interposer circuits, and coupling optics discussed herein.

The subject technology of the present invention is illustrated, for example, according to various aspects described below. Various examples of aspects of the subject technology are described as numbered clauses (1, 2, 3, etc.) for convenience. These are provided as examples and do not limit the subject technology. It is noted that any of the dependent clauses may be combined in any combination, and placed into an independent clause, e.g., Clauses 1, 18, and 20. The other clauses can be presented in a similar manner. The following is a non-limiting summary of some examples presented herein.

Clause 1. A communication module, comprising:
an integrated circuit (IC);
an electrical interconnect comprising a radio frequency (RF) interconnect or a direct current (DC) interconnect; and
an interposer circuit electrically coupled between the IC and the electrical interconnect.

Clause 2. The communication module of clause 1, wherein the IC comprises an electrical IC including at least one of a driver or a transimpedance amplifier.

Clause 3. The communication module of clause 1, wherein the IC comprises an optical IC including at least one of an optical modulator or an optical receiver.

Clause 4. The communication module of clause 1, wherein the electrical interconnect comprises a first electrical interconnect, the communication module comprising a plurality of electrical interconnects that includes the first electrical interconnect, and wherein the interposer circuit is electrically coupled between the IC and the plurality of electrical interconnects.

Clause 5. The communication module of clause 4, wherein the plurality of electrical interconnects comprises a plurality of RF interconnects and wherein the communication module does not include any wire bonds between the IC and the plurality of RF interconnects.

Clause 6. The communication module of clause 1, wherein the communication module is devoid of wire bonds between the IC and all RF interconnects that are electrically coupled to the IC.

Clause 7. The communication module of clause 1, wherein the electrical interconnect comprises the RF interconnect, further comprising a plurality of RF bumps, including a first RF bump to electrically couple the interposer circuit to the IC and a second RF bump to electrically couple the interposer circuit to the RF interconnect.

Clause 8. The communication module of clause 7, wherein each of the plurality of RF bumps comprises a gold bump.

Clause 9. The communication module of clause 1, wherein the interposer circuit comprises a flex circuit.

Clause 10. The communication module of clause 1, wherein the interposer circuit comprises a rigid circuit.

Clause 11. The communication module of clause 1, wherein a top surface of the IC comprises a perimeter that bounds an interior of the top surface, and wherein the interposer circuit is electrically coupled to the IC within the interior of the top surface.

Clause 12. The communication module of clause 11, wherein the interposer circuit is electrically coupled to the IC at the interior of the top surface at a location of the interior of the top surface that is at least 0.5 millimeters inward from the perimeter of the top surface of the IC.

Clause 13. The communication module of clause 1, wherein:
the IC comprises an optical IC including an optical modulator;
the optical modulator includes a first side from which an optical data signal is output from the optical modulator;
the optical modulator includes a second side opposite the first side, the optical modulator receiving input continuous wave (CW) light at the second side, the input CW light modulated by the optical modulator to generate the optical data signal; and
the interposer circuit is electrically coupled to the optical modulator at or near the second side of the optical modulator.

Clause 14. The communication module of clause 13, further comprising an optical coupling element positioned between the second side of the optical modulator and a source of the input CW light, the interposer circuit extending out of plane over the optical coupling element from the electrical interconnect to the optical modulator.

Clause 15. The communication module of clause 1, wherein the electrical interconnect comprises the RF interconnect and wherein a length of the interposer circuit and a distance between the IC and the RF interconnect is at least 1 millimeter.

Clause 16. The communication module of clause 15, wherein the length of the interposer circuit and the distance between the IC and the RF interconnect is between about 5-10 millimeters.

Clause 17. The communication module of clause 1, wherein the electrical interconnect comprises an electrical interconnect of a hermetic box, an electrical interconnect of a printed circuit board (PCB) of the communication module, or an electrical interconnect of another IC of the communication module.

Clause 18. A communication module, comprising:
one or more integrated circuits (ICs) that include at least one of:
an electrical integrated circuit (IC) comprising at least one of a driver or a transimpedance amplifier; and
an optical integrated circuit (OIC) comprising at least one of an optical source, an optical modulator, or an optical receiver;
a plurality of electrical interconnects comprising radio frequency (RF) interconnects; and
an interposer circuit electrically coupled between a first IC of the one or more ICs and the RF interconnects, wherein the communication module is devoid of wire bonds between the first IC and all RF interconnects that are electrically coupled to the first IC.

Clause 19. The communication module of clause 18, wherein the interposer circuit is routed out of plane between the first IC and the RF interconnects.

Clause 20. A communication module, comprising:
an optical integrated circuit (OIC) comprising an optical modulator;
an electrical interconnect comprising a radio frequency (RF) interconnect or a direct current (DC) interconnect;

an interposer circuit electrically coupled between the optical modulator and the electrical interconnect; and an optical coupling element positioned between a source of continuous wave (CW) input light and an input of the optical modulator, wherein:

the input of the optical modulator is located at a same side of the optical modulator to which the interposer circuit is coupled to input an RF modulation signal to the optical modulator; and the interposer circuit extends out of plane over the optical coupling element from the electrical interconnect to the optical modulator.

Unless specific arrangements are mutually exclusive with one another, the various implementations described herein can be combined to enhance system functionality and/or to produce complementary functions. Such combinations will be readily appreciated by the skilled addressee given the totality of the foregoing description. Likewise, aspects of the implementations may be implemented in standalone arrangements where more limited and thus specific component functionality is provided within each of the interconnected—and therefore interacting—system components albeit that, in sum, they together support, realize and produce the described real-world effect(s). Indeed, it will be understood that unless features in the particular implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will, therefore, be appreciated that the above description has been given by way of example only and that modification in detail may be made within the scope of the present invention.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as "an aspect" may refer to one or more aspects and vice versa. A phrase such as "an embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such "an embodiment" may refer to one or more embodiments and vice versa. A phrase such as "a configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as "a configuration" may refer to one or more configurations and vice versa.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. Moreover, nothing disclosed herein is intended to be dedicated to the public regardless of whether such disclosure is explicitly recited in the above description.

The present disclosure is not to be limited in terms of the particular embodiments described herein, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of this disclosure. Also, the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that include A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

For any and all purposes, such as in terms of providing a written description, all ranges disclosed herein also encompass any and all possible sub ranges and combinations of sub ranges thereof. Any listed range can be easily recognized as sufficiently describing and enabling the same range being broken down into at least equal halves, thirds, quarters, fifths, tenths, and/or others. As a non-limiting example, each range discussed herein can be readily broken down into a lower third, middle third and upper third, etc. All language such as "up to," "at least," and the like include the number recited and refer to ranges which can be subsequently broken down into sub ranges as discussed above. Finally, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, various embodiments of the present disclosure have been described herein for purposes of illustration, and various modifications may be made without departing from the scope and spirit of the present disclosure. Accordingly, the various embodiments disclosed herein are not intended to be limiting.

What is claimed is:

1. A communication module, comprising:
an integrated circuit (IC) including an optical modulator having an input end and an output end, the input end configured to receive source light, the modulator being configured to modulate the source light into an optical data signal based on a modulation signal, the output end being configured to output the optical data signal;
an electrical interconnect comprising a radio frequency (RF) interconnect or a direct current (DC) interconnect for the modulation signal;
an optical coupling element optically coupling the source light to the input end of the optical modulator; and
an interposer circuit electrically coupled between the input end of the optical modulator and the electrical interconnect, the interposer circuit extending out of plane between the input end and the electrical interconnect over the optical coupling element.

2. The communication module of claim 1, wherein the IC comprises an electrical IC including at least one of a driver or a transimpedance amplifier.

3. The communication module of claim 1, wherein the electrical interconnect comprises a first electrical interconnect, the communication module comprising a plurality of electrical interconnects that includes the first electrical interconnect, and wherein the interposer circuit is electrically coupled between the IC and the plurality of electrical interconnects.

4. The communication module of claim 3, wherein the plurality of electrical interconnects comprises a plurality of RF interconnects; and wherein the communication module does not include any wire bonds between the IC and the plurality of RF interconnects.

5. The communication module of claim 1, wherein the communication module is devoid of wire bonds between the IC and all RF interconnects that are electrically coupled to the IC.

6. The communication module of claim 1, wherein the electrical interconnect comprises the RF interconnect, further comprising a plurality of RF bumps, including a first RF bump to electrically couple the interposer circuit to the IC and a second RF bump to electrically couple the interposer circuit to the RF interconnect.

7. The communication module of claim 6, wherein each of the plurality of RF bumps comprises a gold bump.

8. The communication module of claim 1, wherein the interposer circuit comprises a flex circuit.

9. The communication module of claim 1, wherein the interposer circuit comprises a rigid circuit.

10. The communication module of claim 1, wherein a top surface of the IC comprises a perimeter that bounds an interior of the top surface, and wherein the interposer circuit is electrically coupled to the IC within the interior of the top surface.

11. The communication module of claim 10, wherein the interposer circuit is electrically coupled to the IC at the interior of the top surface at a location of the interior of the top surface that is at least 0.5 millimeters inward from the perimeter of the top surface of the IC.

12. The communication module of claim 1, wherein:
the output end of the optical modulator includes a first side from which an optical data signal is output from the optical modulator;
the input end of the optical modulator includes a second side opposite the first side, the optical modulator receiving input continuous wave (CW) light as the source light at the second side, the input CW light modulated by the optical modulator to generate the optical data signal; and
the interposer circuit is electrically coupled to the optical modulator at or near the second side of the optical modulator.

13. The communication module of claim 1, wherein the electrical interconnect comprises the RF interconnect; and wherein a length of the interposer circuit and a distance between the IC and the RF interconnect is at least 1 millimeter.

14. The communication module of claim 13, wherein the length of the interposer circuit and the distance between the IC and the RF interconnect is between about 5-10 millimeters.

15. The communication module of claim 1, wherein the electrical interconnect comprises an electrical interconnect of a hermetic box, an electrical interconnect of a printed circuit board (PCB) of the communication module, or an electrical interconnect of another IC of the communication module.

16. A communication module, comprising:
one or more integrated circuits (ICs) that include at least one of:
an electrical integrated circuit (IC) comprising at least one of a driver or a transimpedance amplifier; and
an optical integrated circuit (OIC) comprising at least one of an optical source, an optical modulator, or an optical receiver;
a plurality of electrical interconnects comprising radio frequency (RF) interconnects; and
an interposer circuit electrically coupled between a first IC of the one or more ICs and the RF interconnects,
wherein the interposer circuit is routed out of plane between the first IC and the RF interconnects, and
wherein the communication module is devoid of wire bonds between the first IC and all RF interconnects that are electrically coupled to the first IC.

17. A communication module, comprising:
an optical integrated circuit (OIC) comprising an optical modulator;
an electrical interconnect comprising a radio frequency (RF) interconnect or a direct current (DC) interconnect;
an interposer circuit electrically coupled between the optical modulator and the electrical interconnect; and
an optical coupling element positioned between continuous wave (CW) input light and an input of the optical modulator, wherein:
the input of the optical modulator is located at a same side of the optical modulator to which the interposer circuit is coupled to input an RF modulation signal to the optical modulator; and
the interposer circuit is a flex circuit that is flexed out of plane over the optical coupling element from the electrical interconnect to the optical modulator.

18. The communication module of claim 17, wherein optical modulator has an input end and an output end, the input end having the input and being configured to receive the continuous wave (CW) input light, the modulator being configured to modulate the continuous wave (CW) input light into an optical data signal based on the RF modulation signal, the output end being configured to output the optical data signal, the flex circuit of the interposer circuit bending out of plane between the input end and the electrical interconnect over the optical coupling element.

19. The communication module of claim 17, wherein the communication module comprises a source of the continuous wave (CW) input light.

20. The communication module of claim 16, wherein the interposer circuit is a flex circuit that is flexed out of plane between the first IC and the RF interconnects.

* * * * *